United States Patent
Blackmon et al.

(10) Patent No.: US 6,963,516 B2
(45) Date of Patent: Nov. 8, 2005

(54) DYNAMIC OPTIMIZATION OF LATENCY AND BANDWIDTH ON DRAM INTERFACES

(75) Inventors: Herman Lee Blackmon, Moline, IL (US); John Michael Borkenhagen, Rochester, MN (US); Joseph Allen Kirscht, Rochester, MN (US); James Anthony Marcella, Rochester, MN (US); David Alan Shedivy, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 387 days.

(21) Appl. No.: 10/306,142

(22) Filed: Nov. 27, 2002

(65) Prior Publication Data
US 2004/0103258 A1 May 27, 2004

(51) Int. Cl.[7] ............................................. G06F 13/16
(52) U.S. Cl. ..................... 365/233; 710/58; 710/59; 710/60
(58) Field of Search .............................. 710/25, 36, 45, 710/58, 59, 60; 365/193, 194, 230.08, 233, 233.5; 711/167

(56) References Cited

U.S. PATENT DOCUMENTS

| | | | | |
|---|---|---|---|---|
| 5,544,124 A | * | 8/1996 | Zagar et al. | 365/230.08 |
| 6,418,067 B1 | * | 7/2002 | Watanabe et al. | 365/200 |
| 6,542,416 B1 | * | 4/2003 | Hampel et al. | 365/194 |

* cited by examiner

Primary Examiner—B. James Peikari
(74) Attorney, Agent, or Firm—James R. Nock

(57) ABSTRACT

A method and apparatus is provided which dynamically alters SDRAM memory interface timings to provide minimum read access latencies for different types of memory accesses in a memory subsystem of a computer system. The dynamic alteration of the SDRAM memory interface timings is based on workload and is determined with information from the memory controller read queue.

22 Claims, 7 Drawing Sheets

DYNAMIC OPTIMIZATION OF LATENCY AND BANDWIDTH ON DRAM INTERFACES

FIELD OF THE INVENTION

The present invention relates generally to computer systems, and more specifically to dynamic random access memory (DRAM) of a computer system.

BACKGROUND OF THE INVENTION

Digital computer systems typically comprise one or more processors coupled to a memory subsystem via a processor bus. The memory subsystem typically includes a memory controller coupled to one or more Synchronous Dynamic Random Access Memory (SDRAM) modules via a memory data bus and associated control signals. The memory controller is responsible for accepting memory load and store requests from the processor, interfacing with the SDRAMs to perform a load or store operation, and returning any data associated with the load operation from the SDRAMs back to the processor. The memory controller also has the task of managing memory bank timing, maximizing the utilization of the memory data bus, and prioritizing reads over writes, when possible.

In order to maximize performance in a computer system, it is important for the memory subsystem to provide both minimum read access latency and maximum memory bandwidth. Latency (i.e., cycle time) is the minimum interval between the initiation of a data request from the processor until data is first returned to the processor. Memory bandwidth is the amount of data that can be transferred in a fixed period of time. Maximum memory bandwidth is important to limit the queuing effects from high memory traffic. Queuing effects will increase latency, slowing computer system performance.

Memory is organized into banks and pages. A memory bank is a logical unit of memory in a computer system, the number of banks is determined by the DRAM technology employed. A bank can consist of pages, the number of pages determined by the column addresses bits employed. In SDRAM memory, a memory page is defined by the number of bits that can be accessed from one row address. Thus, the size of a page is determined by the number of column addresses. For example, a device with 10 column address pins has a page depth of 1024 bits.

SDRAMs can be operated in page mode, with many accesses to the same page, or non-page mode, where each memory access opens a bank, performs the memory access, and closes the bank with auto precharge. Commercial workloads have a high percentage of random accesses, so page mode does not provide any performance benefit, and in fact can actually decrease performance because of additional close page, precharge and access operations. In non-page mode, SDRAMs are designed for peak performance when consecutive accesses are performed to different banks. Address mapping to the SDRAMs is performed by the memory controller. The memory controller maps the addresses such that sequential accesses go to different memory banks.

In computer memory technology, RAS (row address strobe) is a signal sent to a dynamic random access memory (SDRAM) that tells it that an associated address is a row address. A data bit in the SDRAM is stored in a cell located by the intersection of a column address and a row address. A column address strobe (CAS) signal is used to validate the column address.

A read operation is performed by activating a memory bank (i.e., issuing a RAS with a bank ID), executing the read (i.e., issuing a CAS with READ), waiting the requisite number of cycles for the CAS latency (tCL), then data is burst from the SDRAM into the memory controller. The memory controller must wait several cycles for the row to precharge (i.e., the tRP time) before reactivating that bank.

Similarly, a write operation is performed by activating a memory bank (i.e., issuing a RAS with a bank ID), issuing a write command (i.e., issuing a CAS with WRITE), waiting the requisite number of cycles for the CAS latency (tCL), bursting the data from the memory controller to the SDRAMs, then waiting for the write recovery (i.e., the tWR time) as well as the row precharge time (tRP).

Both Single Data Rate (SDR) and Double Data Rate (DDR) SDRAMs have a minimum timing requirement between driving RAS and driving CAS. This timing requirement is called tRCD. To achieve minimum read access latency for a single access, the memory controller typically uses the minimum allowable time between driving RAS and CAS on a read access.

Early DRAMs had separate row and column address signals so there is no conflict between activating a bank and subsequently reading from that bank. With the invention of Synchronous DRAM's, the address signals for the row and column are multiplexed on the same control bus and qualified by the RAS and CAS, respectively. Thus, if a system has the same number of cycles required for a data transfer (i.e., burst length) as is required for the RAS to CAS latency (tRCD), a conflict is introduced between achieving minimum latency and maximum bandwidth.

Thus, there is a need for a DRAM control mechanism that dynamically adjusts DRAM tRCD (RAS to CAS delay) timings to provide optimal latency during both high and low periods of memory traffic.

SUMMARY OF THE INVENTION

The present invention provides a method and apparatus which dynamically alters SDRAM memory interface timings to provide minimum read access latencies for different types of memory accesses during normal operation of a memory subsystem. The dynamic alteration of the SDRAM memory interface timings is based on workload and is determined by information provided by the memory controller read queue.

In a preferred embodiment, the present invention provides a method of optimizing latency and bandwidth for a memory subsystem within a computer system. The method begins by monitoring the type of memory accesses pending within the memory subsystem, then dynamically adjusts memory interface timings within the memory subsystem based upon the type of memory accesses pending within the memory subsystem. The types of memory access include, but are not limited to, N consecutive read accesses to different memory banks, and at least two read accesses to the same memory bank for N consecutive read accesses. In a preferred embodiment, the memory interface timings include the time interval between driving a bank open command and issuing a read command within the memory subsystem, known as tRCD. The tRCD parameter is adjusted if the type of memory accesses pending within the memory subsystem switches from N consecutive read accesses to different memory banks to at least two read accesses to the same memory bank, or vice versa. More specifically, tRCD is adjusted upward if the next N memory accesses pending in the memory controller read queue indicates that the memory accesses are to different banks of memory. Similarly, tRCD is adjusted downward if the next N commands in the memory subsystem read queue are not to different banks of memory. Queued refresh commands are ignored with monitoring the type of memory accesses pending within the memory subsystem.

The present invention also provides a method for optimizing latency and bandwidth for a memory subsystem within a computer system, the method beginning by receiving a read command within the memory subsystem. Next, the address information from the read command is translated. The read command is then routed directly to a memory sequencer if there are no commands awaiting execution within the read queue, or is alternately routed to the memory subsystem read queue if there are commands awaiting execution within the read queue. The memory subsystem is monitored to determine the type and addresses of read commands awaiting execution, and the memory interface timings are dynamically adjusted based on this monitored information. If there are currently no read commands pending at the sequencer, a new command is dispatched from the memory controller read queue to the memory sequencer. Next, the read command currently awaiting execution at the sequencer is executed.

The present invention further provides a computer system having a processor, and a memory controller coupled to the processor via a processor bus. The memory controller includes a memory controller read queue for queuing access commands issued by the processor. The memory controller further includes a monitor for monitoring the type of memory accesses pending within the memory controller read queue. The computer system further includes a memory coupled to the memory controller via a memory bus, wherein the memory controller adjusts memory interface timings between the memory controller and the memory based upon the type of memory accesses pending within the memory controller read queue.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

DETAILED DESCRIPTION OF THE PREFERRED EMBODIMENTS

Figure 1:
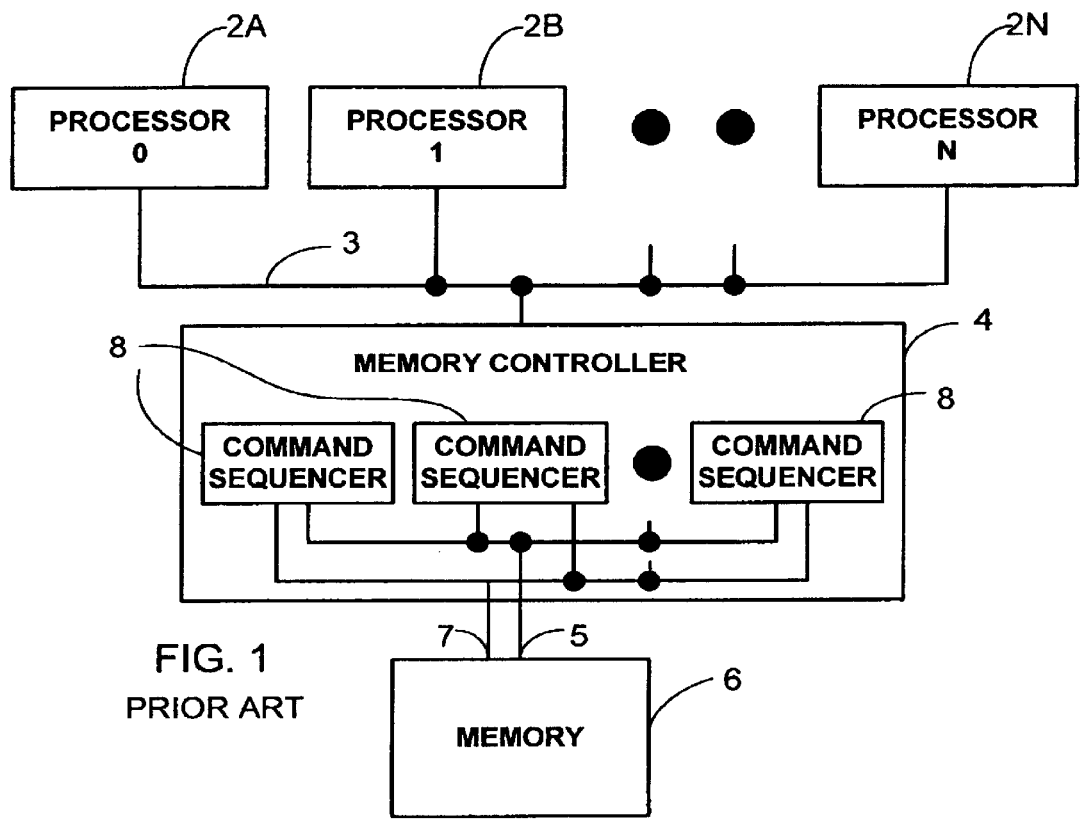
FIG. 1 (Prior Art) illustrates a high-level block diagram of a computer system in accordance with the present invention.

Turning to the Drawings, wherein like numbers denote like parts throughout the several views, FIG. 1 illustrates a high-level block diagram of a computer system in accordance with the present invention. The computer comprises one or more processors. Modern computers typically have a single processor, two processors, four processors, eight processors, sixteen processors, or more. Processors 2A–2N are coupled to a memory 6 by a memory controller 4. Memory 6 can be any level of cache or main memory; in particular, memory 6 is advantageously implemented in DRAM for the present invention. A processor data bus 3 couples processors 2A–2N to memory controller 4. A memory data bus 5 couples memory controller 4 to memory 6. Optimizing the use of bandwidth available on the memory data bus 5 is important to maximize the throughput of the computer system. Memory data bus 5 should not be idle when there are outstanding requests for data from processors 2A–2N.

A conventional memory controller 4 comprises a number of command sequencers 8. Each command sequencer 8 manages one request at a time (a load request or a store request). Command sequencer 8, when in control of memory data bus 5, is responsible for driving bank activate commands, the read/write commands and other associated commands to memory 6 over a command bus 7. Control typically passes from one command sequencer 8 to another command sequencer 8 in a round-robin fashion. Memory controller 4 strives to make sure that each command sequencer 8 has a request to handle, to the degree possible in the current workload.

Figure 2:
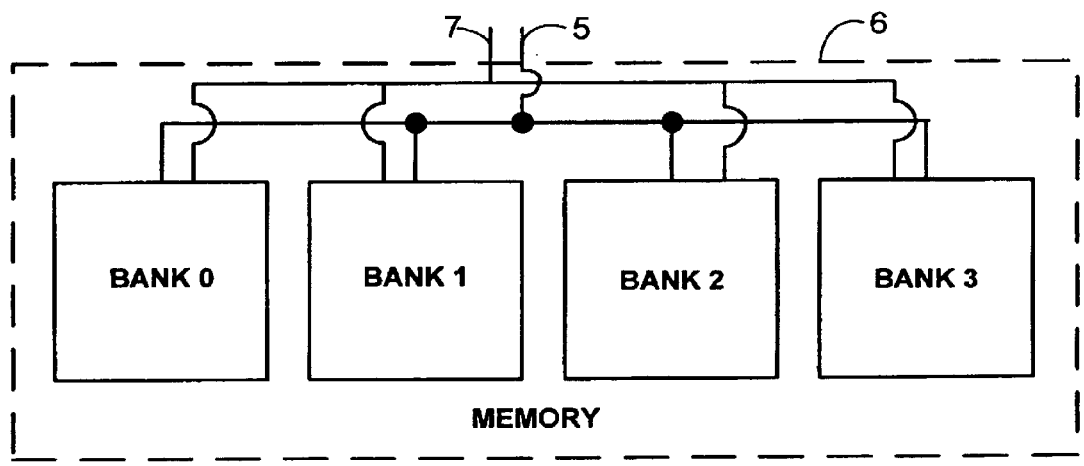
FIG. 2 (Prior Art) illustrates a more detailed view of the memory of the computer system shown in FIG. 1.

FIG. 2 illustrates a more detailed view of memory 6, showing that memory 6 comprises banks (e.g., bank 1, bank 2, etc.). Four banks are shown for illustrative purposes, but differing numbers of banks can be implemented within different designs. Each bank has a set of timing requirements. In some applications, e.g., numeric intensive applications, a particular type of DRAM (e.g., Synchronous DRAM, or SDRAM) can be operated in page mode, with many accesses occurring to the same page, where the page is the same as a bank. Commercial workloads typically have a high percentage of random accesses, so page mode can actually incur a performance penalty, in this instance. In non-page mode, SDRAMs are designed for peak performance when consecutive accesses are performed to different banks. A read is first performed by issuing a bank activate command (e.g., a RAS (Row Address Strobe) command), waiting a requisite number of cycles (i.e., RAS to CAS delay or tRCD), issuing a read command (i.e., applying a CAS (Column Address Strobe) command), waiting a requisite number of cycles for the CAS latency (tCL), after which the data is transmitted from the bank into the memory controller 4. Memory controller 4 must wait several cycles for the row in the back to precharge (tRP) before reactivating that bank.

Similarly, a write is performed by opening a bank (i.e. issuing a RAS), issuing a write command along with a CAS, and transmitting data from memory controller 4 to the SDRAMs in the opened bank. That bank cannot be re-accessed until a write recovery (tWR) has elapsed, as well as the row precharge time (tRP).

Switching the SDRAM data bus from performing a read to a write is expensive in terms of time, requiring the amount of time to clear the data bus of the read data from the last read command. When switching from writes to reads, the write data must be sent to the SDRAMs and the write recovery time must complete before a read command can be sent. The penalty incurred when switching from reads to write, or writes to reads, is called the bus turnaround penalty.

Figure 3:
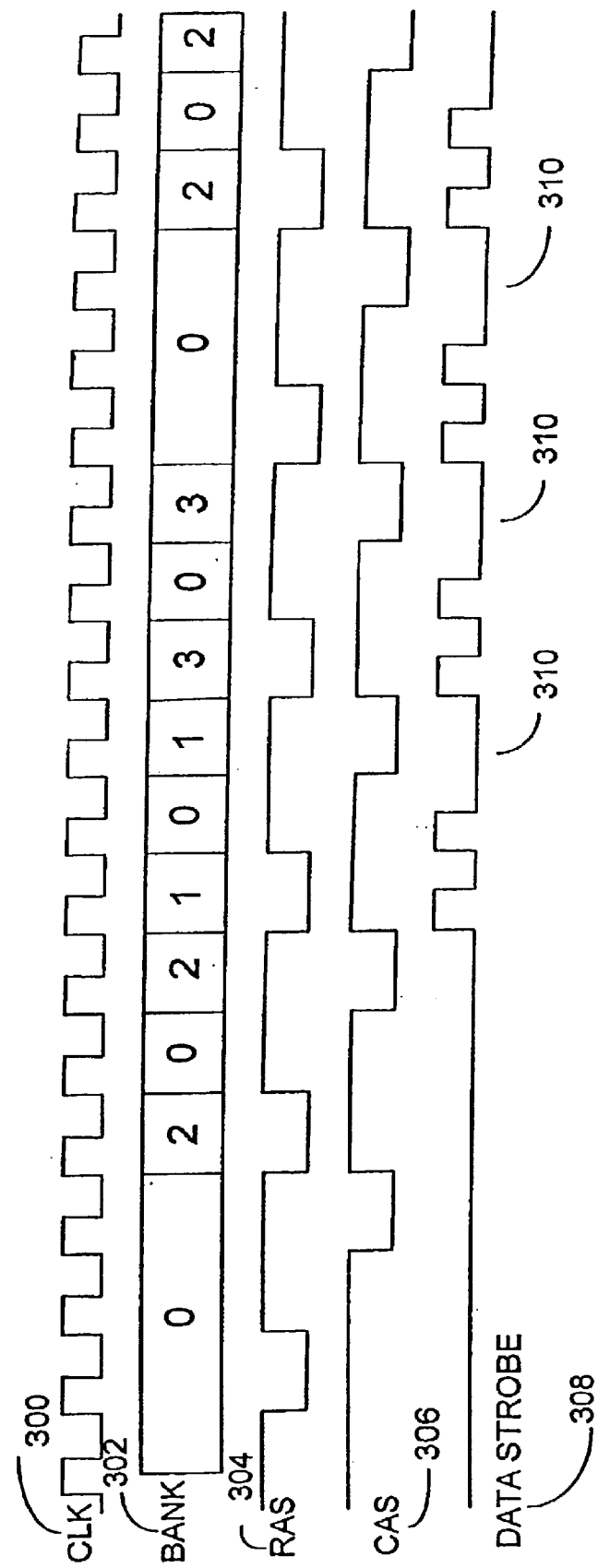
FIG. 3 shows a timing diagram for multiple read accesses to different memory banks using DRAM specification timing requirements of tRCD=2 and tCL=2.

FIG. 3 shows a timing diagram for multiple consecutive read accesses to different memory banks using DRAM specification timing requirements of tRCD=2 and tCL=2. Signal trace 300 represents a clocking signal. Signal trace 302 indicates the currently active bank of memory being accessed (e.g., bank 0, bank 1, bank 2 or bank 3, represented by "0", "1", "2", and "3", respectively). Signal trace 304 represents the bank activate command (e.g., RAS signal), and signal trace 306 represents issuing the read command (e.g., CAS signal). Finally, signal trace 308 represents the data strobe signal on the data bus.

This exemplary DRAM configuration requires 2 system clock cycles to satisfy a data load request. To minimize access latency on all reads and fully utilize the data bus with tRCD=2 timings, the bank activate command (e.g. RAS signal) 304 for a subsequent access should be driven at the same time as the read command (e.g. CAS signal) 306 for the current access. However, it is not possible to send bank activate and read command signals at the same time because the associated row and column addresses for the RAS signal and the CAS signal share common wires. As a result, the RAS signal 304 for the subsequent access has to be delayed one cycle past the CAS signal 306 of the current access. This adds latency to the second access and results in a one cycle dead gap in the data bus, as shown at 310. The latency of subsequent accesses continues to increase.

Figure 4:
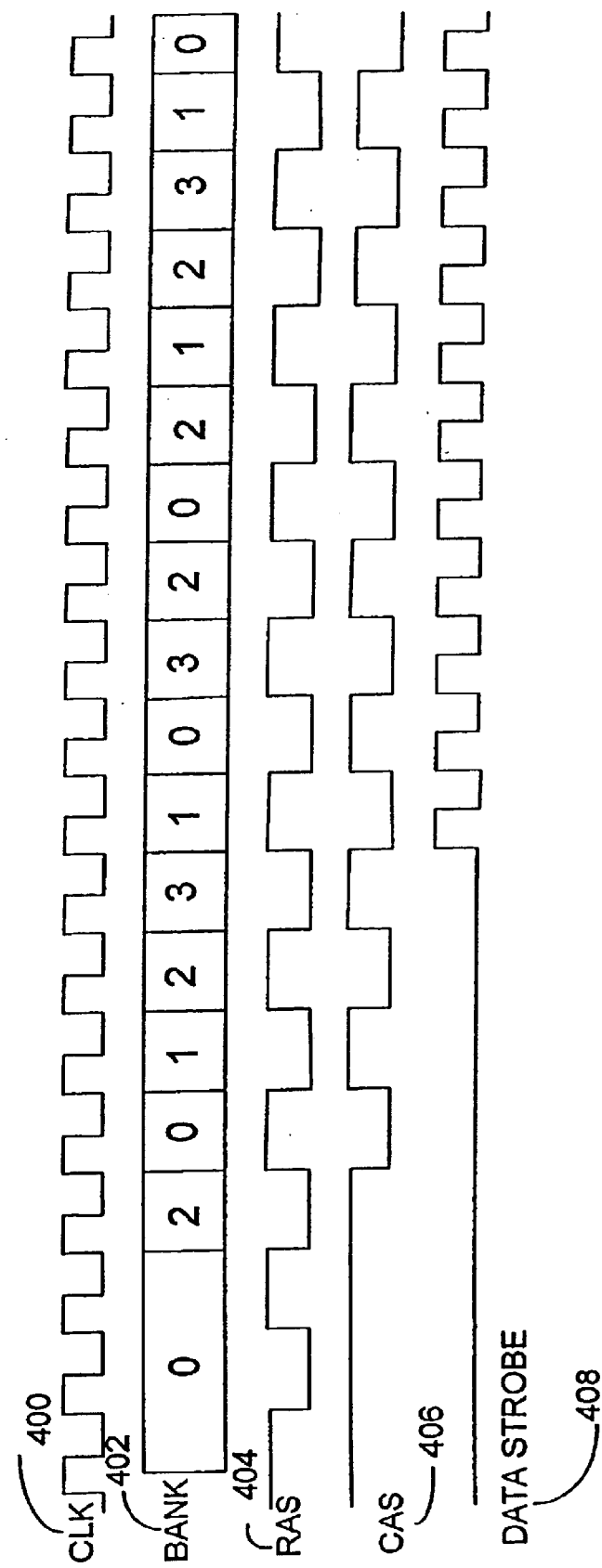
FIG. 4 shows a timing diagram for multiple read accesses to different banks using DRAM specification timing requirements of tRCD=3 and tCL=2.

FIG. 4 illustrates a timing diagram for multiple consecutive read accesses to different memory banks where the tRCD timing is increased to 3. Signal trace 400 represents a clock signal. Signal trace 402 indicates the currently active bank of memory being accessed (e.g., bank 0, bank 1, bank 2 or bank 3, represented as "0", "1", "2" and "3", respectively). Signal trace 404 represents the bank activate command (e.g., RAS signal), and signal trace 406 represents the read command (i.e., CAS signal). Finally, signal trace 408 represents the data strobe signal on the data bus.

In the case where there are multiple sequential accesses waiting, using a tRCD=3 adds a cycle of latency to the first access, but reduces the latency of subsequent accesses. In this instance, the RAS signal 404 for a subsequent access is activated before the CAS signal 406 of the current access. As a result, there is no longer a dead gap cycle on the data bus 408. Thus, the RAS/CAS pairing for the current access is now interleaved with the RAS/CAS pairing for the subsequent access, eliminating the dead cycle encountered when tRCD=2. Thus, over multiple accesses, the average latency of the accesses is less than with tRCD=2, even though the latency of the first access is longer.

Figure 5:
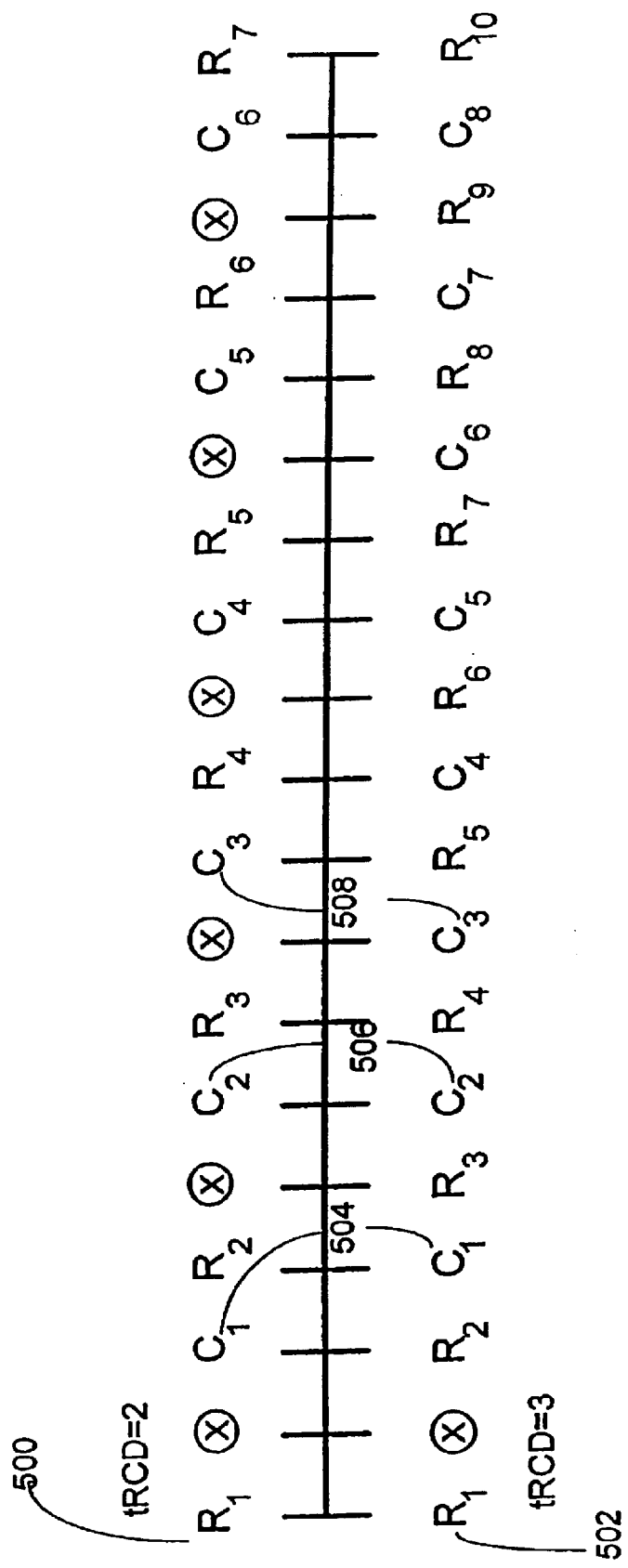
FIG. 5 shows a comparison of instruction throughput between tRCD=2 and tRCD=3 settings when the memory controller read queue is full.

FIG. 5 illustrates comparative RAS/CAS timings for multiple consecutive queued read accesses where the consecutive read accesses are to different memory banks, for a first instance 500 where tRCD=2, and for a second instance 502 where tRCD=3. As seen at 504, the first RAS/CAS operation is completed one cycle earlier for the first instance 500 (i.e., where tRCD=2) than for the second instance 502 (i.e., where tRCD=3). However, by the time the second RAS/CAS pairing is complete, the dead gap cycle required where tRCD=2 begins to take its toll. As shown at 506, the second instance 502 (i.e., where tRCD=3) completes the second CAS read operation at virtually the same time as the first instance 500 (i.e., where tRCD=2). By the time the third RAS/CAS pairing has completed (as shown at 508), the second instance 502 (i.e., where tRCD=3) begins to offer a throughput advantage. This advantage is extended for subsequent operations. As a result, when multiple read accesses are pending (e.g., sequential accesses), the second instance 502 (i.e., where tRCD=3) offers a substantial performance advantage. Conversely, for random read accesses, the first instance 500 (i.e., where tRCD=2) offers a performance advantage.

As a result, an object of the present invention is to determine the type of workload pending in the memory controller read queue (i.e., whether the workload is a queued sequential workload or a random workload), then dynamically adjust the tRCD setting accordingly to optimize throughput and latency.

In summary, if there are multiple consecutive read accesses queued to multiple non-repeating DRAM banks, tRCD=3 provides the best overall average latency. If there are not multiple consecutive read accesses queued to different DRAM banks, tRCD=2 provides the best latency. The present invention provides a method and apparatus to provide an optimal overall average latency by dynamically adjusting the time interval between sending bank open and read commands (e.g., switching between tRCD=2 and tRCD=3) for memory reads. The determination of the optimal setting is done based on the state of the memory controller read queue.

The memory controller serves as a monitor of the memory controller read queue (i.e., monitoring whether the read accesses are of a first type (i.e., N consecutive read accesses to different memory banks) or a second type (i.e., at least two read accesses to the same memory bank for N consecutive read accesses), then dynamically adjusts the memory interface timings (tRCD) based on the type of memory accesses pending in the memory controller read queue.

Figure 6:
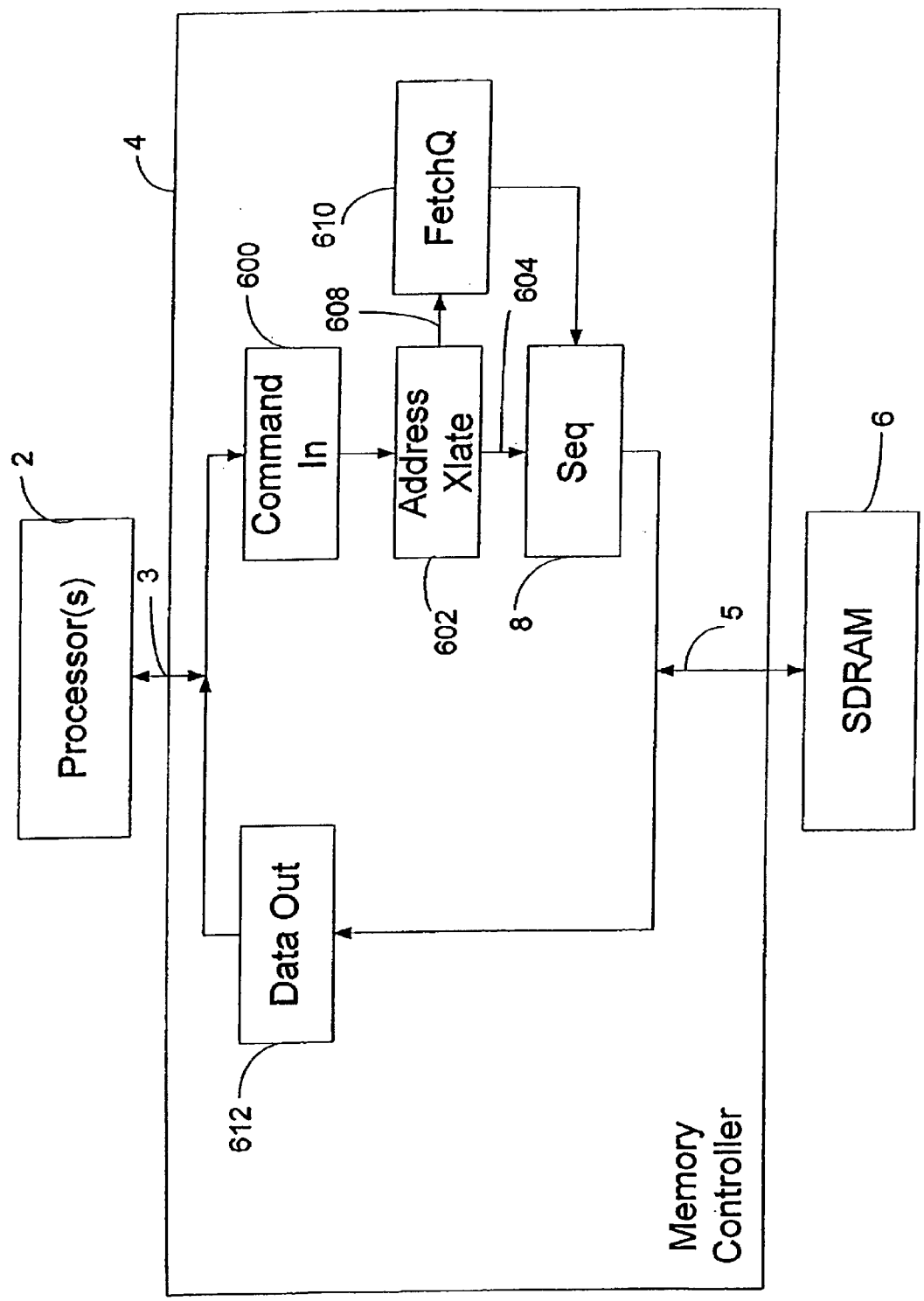
FIG. 6 illustrates how a read command enters a memory controller in accordance with the present invention.

FIG. 6 illustrates how a read command enters memory controller 4 in accordance with the present invention. Memory controller 4 is designed to accept read commands 600 from processor data bus 3, execute the read on a DRAM interface, and return data to processor 2 via a data out 612. First, the address information from the read command is translated via a translator, as shown at 602. The translated read command is then sent directly to DRAM sequencer logic 8 if there are no read commands waiting in the Read Queue 610. Alternately, the translated read command is sent to the Read Queue 610 if the DRAM sequencer 8 is busy processing previous reads and cannot start the read access on the DRAM interface, as shown at 608. Read commands wait in the Read Queue 610 until DRAM sequencer logic 8 is read to start the read access on the DRAM interface.

In a preferred embodiment of the present invention, tRCD=2 is used as the default for read accesses. This gives the lowest latency for a single read access (e.g., when at least two read accesses are made to the same memory bank for N consecutive read accesses). If N consecutive read access requests are made and these requests are to different banks (e.g., walking memory), tRCD=3 provides lower overall average latency and full utilization of the data bus bandwidth. In a preferred embodiment, the memory controller logic looks back three entries in the read queue (e.g., where N=3). If the next three read queue entries are to different banks, the SDRAM sequencers are instructed to switch to tRCD=3 mode. As long as the next three entries in the read queue are valid and are to different banks, the DRAM sequencers are continually told to operate in tRCD=3 mode. This method provides low latency (e.g., tRCD=2) accesses for single type accesses, while still supporting the full data bus bandwidth for multiple consecutive accesses to different data banks by switching to a higher minimum time value between driving RAS and driving CAS (e.g., tRCD=3).

The parameter values tRCD=2 and tRCD=3 are used within the preferred embodiment of the present invention, however these values can and likely would change in different embodiments of the present invention. Also, different memory interface timing parameters may be used, and still remain within the scope and spirit of the present invention. For example, even if tRCD assumes different values for different designs, the core concept of dynamically adjusting memory interface timing based upon the type of memory accesses pending within the memory subsystem still remains.

Refresh commands are also held in the read queue. Refresh commands are ignored for the tRCD=3 determination because they activate all banks and are optimally held (bypassed) in the queue until there are no reads to execute. Thus, if a refresh command is in one of the bottom three entries in the queue, the bottom four commands are used for the tRCD=3 determination. For the sake of simplicity, tRCD=3 is always used for writes where bandwidth is more important than latency.

Figure 7:
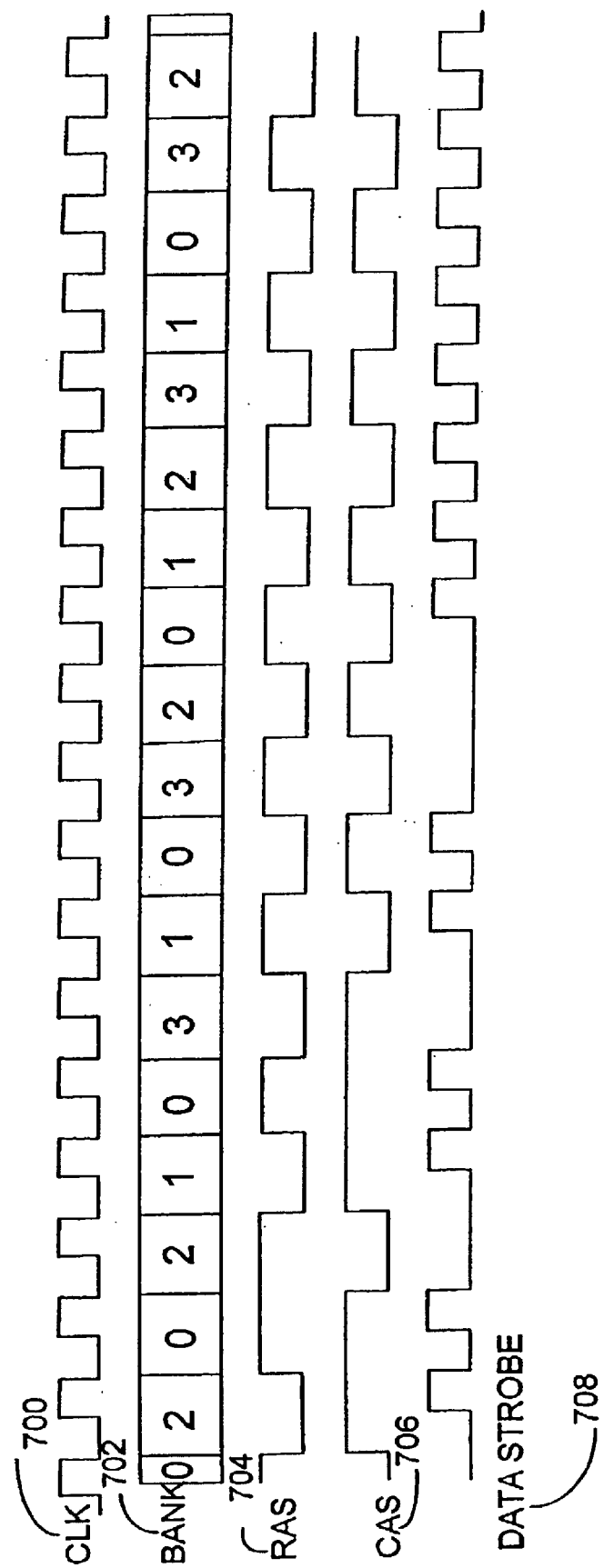
FIG. 7 illustrates how the memory controller dynamically changes from the tRCD=2 default mode to tRCD=3 mode when three or more accesses to different banks are outstanding.

FIG. 7 illustrates how the memory controller dynamically changes from tRCD=2 default mode to tRCD=3 mode when three or more consecutive accesses to different memory banks are outstanding. Signal trace 700 represents a clock signal. Signal trace 702 indicates the currently active bank of memory being accesses (e.g., bank 0, bank 1, bank 2 or bank 3, represented as "0", "1", "2" and "3", respectively). Signal trace 704 represents the RAS signal, and signal trace 706 represents the CAS signal. Finally, signal trace 708 represents the data strobe signal on the data bus.

As previously stated, the default mode for the memory controller is tRCD=2, and the state will remain at tRCD=2 until three or more consecutive accesses to different banks are outstanding. In the illustrated example, accesses alternate between two banks (i.e., at least two read accesses to the same memory bank for N=3 consecutive read accesses) until time mark 710, at which time the accesses alternate between three or more banks. These consecutive accesses to three or more different banks are previously detected while the instructions are waiting in the read queue. After the access type changes, the sequencers change the mode in the memory controller to tRCD=3, and RAS signal trace 704 and CAS signal trace 706 assume a new periodicity. As a result of this change, the cycle skip in the data strobe signal trace 708, illustrated at 714, is eliminated.

Examples of situations where tRCD=3 mode will be encountered include, but are not limited to: DMA page outs, processor code loads, and any applications that sequentially access memory. For the majority of commercial processing where access patterns are random, the memory controller remains in the default tRCD=2 mode to provide the minimum random access latency.

Figure 8:
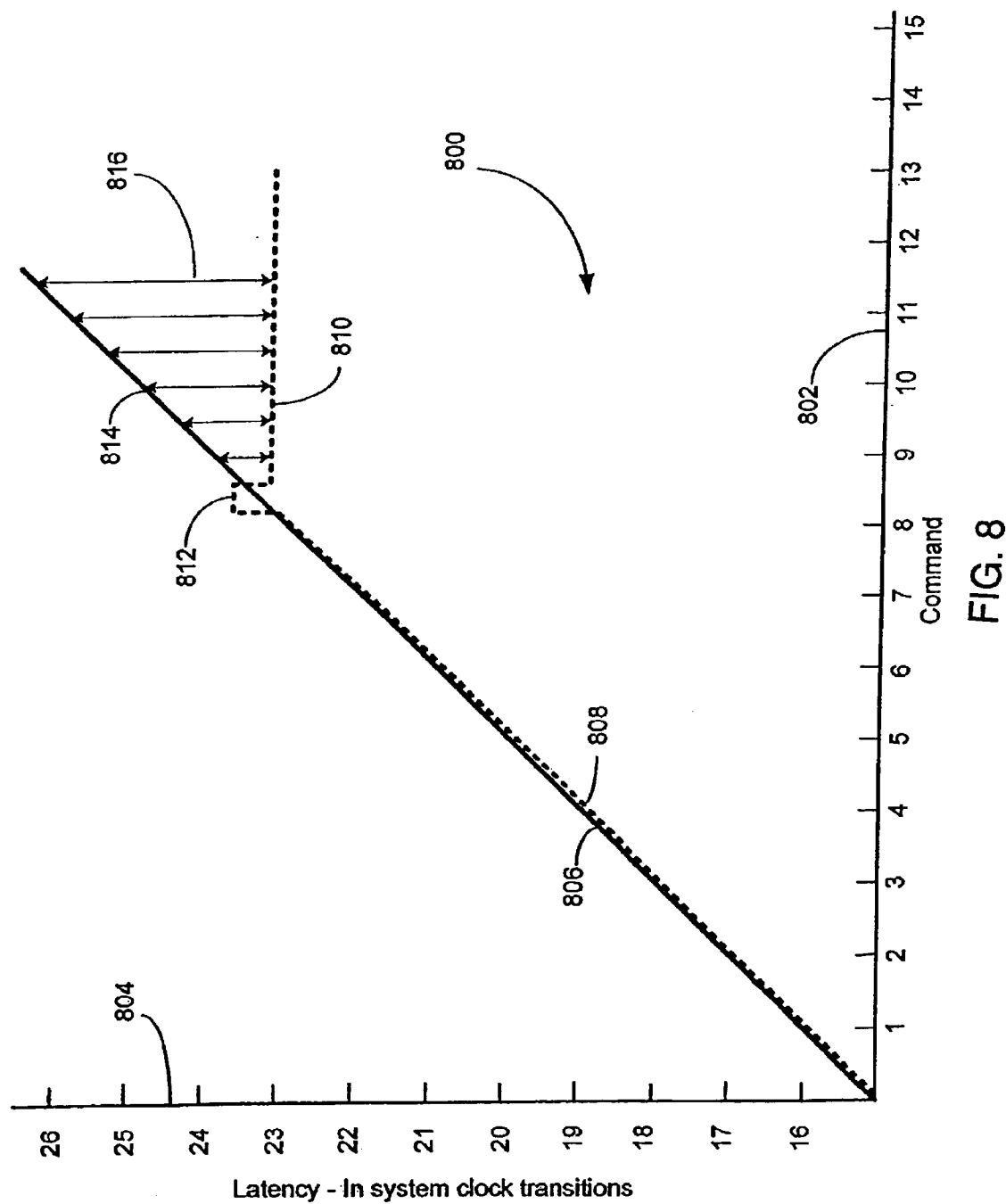
FIG. 8 illustrates a timing diagram from two simulation runs which shows the latency for memory accesses when keeping tRCD=2 for the first run, and the latency for memory accesses when dynamically changing tRCD from 2 to 3 for the second run.

FIG. 8 illustrates a timing diagram 800 from two simulation runs which shows the latency for memory accesses when keeping tRCD=2 for a first run 806, and the latency for memory accesses when dynamically changing tRCD from 2 to 3 for a second run 808. The x-axis 802 represents the number of the command being executed, while the y-axis 804 represents the latency for the command represented in system clock transitions.

As shown in first run 806, the latency for each successive command in the command queue will increase in a linear fashion when tRCD=2 (i.e., as a result of the one cycle dead gap shown earlier), until the point at which the memory controller read queue is completely filled up with waiting instructions (not shown).

By way of contrast, second run 808 illustrates that the latency for each successive command in the command queue will increase in a linear fashion when tRCD=2, similar to the first run 806. However, when the present invention detects that the memory controller read queue contains at least 3 consecutive accesses to different banks of memory, tRCD=2 is dynamically changed to tRCD=3. After the switch to tRCD=3, the latency encounters a brief hiccup at 812, then remains constant for subsequent commands shown at 810. This results in a significant latency improvement, as illustrated by the arrows at 816.

In summary, the present invention provides a means to dynamically alter SDRAM memory interface timing to provide minimum read access latencies for different memory access types during normal operation. The mode for memory interface timings (e.g., tRCD) is based on workload and is determined with information from the memory controller read queue.

It is intended that the scope of the present invention be limited not by this detailed description, but rather by the claims appended hereto. Additional modifications may be made to the illustrated embodiments without departing from the spirit or scope of the invention. Therefore, the invention lies in the claims hereinafter appended.

What is claimed is:

1. A method for optimizing latency and bandwidth for a memory subsystem within a computer system, the method comprising the steps of:

monitoring the type of memory accesses pending within the memory subsystem; and dynamically adjusting memory interface timings within the memory subsystem based upon the type of memory accesses pending within the memory subsystem;

wherein the types of memory accesses include: N consecutive read accesses to different memory banks, and at least two read accesses to the same memory bank for N consecutive read accesses, where N is a positive integer greater than 1; and wherein the memory interface timings include the time interval between driving a bank activate command and a read/write command within the memory subsystem, known as tRCD.

2. The method of claim 1, wherein tRCD is adjusted if the type of memory accesses pending within the memory subsystem switches from at least two read accesses to the same memory bank for N consecutive read accesses to N consecutive read accesses to different memory banks.

3. The method of claim 2, wherein tRCD is adjusted upward if the next N memory accesses pending in a memory controller read queue in the memory subsystem indicate that the memory accesses are to different banks of memory.

4. The method of claim 3, wherein N equals three memory accesses.

5. The method of claim 1, wherein tRCD is adjusted if the type of memory access pending within the memory subsystem switches from N consecutive read accesses to different memory banks to at least two read accesses to the same memory bank for N consecutive read accesses.

6. The method of claim 5, wherein tRCD is adjusted downward if the next N entries in the memory controller read queue are not to different banks of memory.

7. The method of claim 6, wherein N equals 3 entries.

8. The method of claim 1, wherein refresh commands are ignored when monitoring the type of memory accesses pending within the memory subsystem.

9. A method for optimizing latency and bandwidth for a memory subsystem within a computer system, the method comprising the steps of:
- receiving a read command within the memory subsystem;
- translating address information from the read command;
- routing the read command directly to a memory sequencer within the memory subsystem if there are no commands awaiting execution within a read queue within the memory subsystem;
- routing the read command to the memory subsystem read queue if there are commands awaiting execution within the memory subsystem read queue;
- monitoring the memory subsystem read queue to determine the type and addresses of read commands awaiting execution;
- dynamically adjusting memory interface timings within the memory subsystem based on the types and addresses of read commands awaiting execution;
- dispatching a new command from the memory controller read queue to the memory sequencer if there are currently no read commands pending at the sequencer; and
- executing the read command currently awaiting execution at the sequencer; wherein the type of read commands include: N consecutive read accesses to different memory banks, and at least two read accesses to the same memory bank for N consecutive read accesses, where N is a positive integer greater than 1; and
- wherein the memory interface timings include the time interval between driving a bank activate command and a read/write command within the memory subsystem, known as tRCD.

10. The method of claim 9, wherein tRCD is adjusted if the type of read commands pending within the memory subsystem switches from at least two read accesses the same memory bank for N consecutive read accesses to N consecutive read accesses to different memory banks.

11. The method of claim 9, wherein tRCD is adjusted upward if the next N read commands pending in the memory subsystem read queue indicate that the read commands are to different banks of memory.

12. The method of claim 11, wherein N equals three memory accesses.

13. The method of claim 9, wherein tRCD is adjusted if the type of memory accesses pending within the memory subsystem switches from N consecutive read accesses to different memory banks to at least two read accesses to the same memory bank for N consecutive read accesses.

14. The method of claim 9, wherein tRCD is adjusted downward if the next N commands in the memory subsystem read queue are not to different banks of memory.

15. The method of claim 14, equals 3 entries.

16. A computer system, comprising:
- a processor;
- a memory controller coupled to the processor, the memory controller including a memory controller read queue for queuing access commands issued by the processor, the memory controller further including a monitor for monitoring the type of memory accesses pending within the memory controller read queue; and
- a memory coupled to the memory controller;
- wherein the memory controller adjusts memory interface timings between the memory controller and the memory based upon the type of memory accesses pending within the memory controller read queue;
- wherein the types of memory accesses pending within the memory controller read queue include: N consecutive read accesses to different memory banks, and at least two read accesses to the same memory bank for N consecutive read accesses, where N is a positive integer greater than 1; and
- wherein the memory interface timings include the time interval between driving a bank activate command and a read/write command within the memory controller, known as tRCD.

17. The computer system of claim 16, wherein tRCD is adjusted if the type of memory accesses pending within the memory controller read queue switches from at least two read accesses the same memory bank for N consecutive read accesses to N consecutive read accesses to different memory banks.

18. The computer system of claim 16, wherein tRCD is adjusted upward if the next N memory accesses pending in the memory controller read queue indicate that the memory accesses are to different banks of memory.

19. The computer system of claim 18, wherein N equals three memory accesses.

20. The method of claim 16, wherein tRCD is adjusted if the type of memory access pending within the memory subsystem switches from N consecutive read accesses to different memory banks to at least two read accesses to the same memory bank for N consecutive read accesses.

21. The method of claim 16, wherein tRCD is adjusted downward if the next N entries in the memory controller read queue are not to different banks of memory.

22. The method of claim 21, wherein N equals 3 entries.

* * * * *